United States Patent [19]
Takagi et al.

[11] Patent Number: 5,304,822
[45] Date of Patent: Apr. 19, 1994

[54] STATIC INDUCTION TYPE SEMICONDUCTOR DEVICE WITH MULTIPLE SOURCE CONTACT REGIONS

[75] Inventors: Haruo Takagi; Shinobu Aoki, both of Kariya; Yukihiko Watanabe, Kasugai; Hiroshi Tadano, Nagoya, all of Japan

[73] Assignees: Kabushiki Kaisha Toyoda Jidoshokki Seisakusho, Kariya; Kabushiki Kaisha Toyota Chuo Kenkyusho, Nagakute, both of Japan

[21] Appl. No.: 877,700

[22] Filed: May 1, 1992

[30] Foreign Application Priority Data

May 10, 1991 [JP] Japan .................................. 3-106080

[51] Int. Cl.$^5$ .............................................. H01L 29/74
[52] U.S. Cl. .................................. 257/136; 257/135; 257/264; 257/268
[58] Field of Search ............... 257/135, 136, 268, 264, 257/256

[56] References Cited

U.S. PATENT DOCUMENTS 4,700,213 10/1987 Nishizawa ........................... 257/264
4,811,064 3/1989 Nishizawa et al. .................. 257/264
5,175,598 12/1992 Nishizawa et al. .................. 257/136

FOREIGN PATENT DOCUMENTS 1-110774 4/1989 Japan .................................. 257/135
1-270276 10/1989 Japan .................................. 257/136

Primary Examiner—Rolf Hille
Assistant Examiner—Minhloan Tran
Attorney, Agent, or Firm—Brooks Hardt Haffner & Delahunty

[57] ABSTRACT

A static induction type semiconductor device of a surface gate type, includes a source region, gate region and drain region. A channel region is formed between the drain region and the source region, such that when a bias potential is applied between the gate region and the source region, carriers flow to the drain region from the source region via the channel region. A source electrode is provided on the semiconductor layer. A source contact region is provided between the source electrode and the source region to establish electrical connection therebetween. The source contact region is segmented into a plurality of smaller regions or sections whose total area is smaller than the area of the corresponding portion of the source region, for improving the current gain, and for preventing or significantly reducing local current concentration.

8 Claims, 3 Drawing Sheets

STATIC INDUCTION TYPE SEMICONDUCTOR DEVICE WITH MULTIPLE SOURCE CONTACT REGIONS

BACKGROUND OF THE INVENTION

1. Field of the Invention

The present invention relates to a static induction type semiconductor device, and, more particularly, to a static induction type semiconductor device of a surface gate type which is used with high density current.

2. Description of the Related Art

Static induction type semiconductor devices have been used as power switching devices to control large currents. These semiconductor devices have a significantly large ratio of the main current to the control current, or a large current gain. One such conventional static induction transistor (hereinafter referred to as "SIT") of a surface gate type, is shown in FIGS. 5 and 6. The illustrated SIT is an n-channel surface gate type transistor in which electrons act as major carriers. An n+ type silicon substrate 21 forms a drain region. Formed on that substrate 21 is an n− type epitaxial layer 22. An n+ type source region 23 and a p+ type gate region 24 are formed on the surface of the epitaxial layer 22. An SiO₂ insulator layer 25 is formed on the epitaxial layer 22 and substantially covers the gate region 24 and the epitaxial layer 22.

A source electrode 27 is formed on the insulation layer 25, and has a source contact region 26 which is formed on the bottom side of the source electrode 27, and which penetrates (extends through) the insulation layer 25. The source electrode 27 is connected to the source region 23 via the source contact region 26. A drain terminal D is formed on the back side of the silicon substrate 21. Part of the epitaxial layer 22 which lies under the source region 23 forms a channel region 28. A p type impurity is implanted or diffused in the channel region 28 as needed, to form a potential barrier for inhibiting the movement of the carriers.

This SIT is in an OFF or inactive state when no forward bias voltage is applied between the gate and the source. Upon application of the forward bias voltage, holes are injected into the channel region 28 from the gate to lower the potential of the channel region 28. This induces electron injection from the source to the drain, and causes the electrons to flow from the source to the drain for activating the SIT.

The conventional SIT illustrated in FIG. 6 has one contact region for each source region 23. The source contact region extends substantially over the entire source region 23. The contact region is large enough to allow the holes to flow from the gate to the source electrode, and to prevent the hole density in the channel region from becoming too large. As a result, the potential variation in the channel region does not permit the electrons injected from the source to become too large. In other words, the conventional SIT has a low current gain $h_{FS}$ (the ratio $I_D/I_G$ of the drain current $I_D$ to the gate current $I_G$).

A static induction type semiconductor device which divides a source region surrounded by a gate region into two or more regions has already been proposed in the Japanese Unexamined Patent Publication No. 1-270276 in an attempt to increase the current gain of the transistor. However, the division of the source region without changing the overall area of the semiconductor device, tends to reduce the total area of the source region, which may cause local current concentration in the SIT device.

SUMMARY OF THE INVENTION

It is therefore an object of the present invention to provide a static induction type semiconductor device which significantly minimizes local current concentration in the SIT device and which provides high current gain.

To achieve the object, a source region is formed on the surface of a substrate or semiconductor layer. A gate region is formed on the surface of the semiconductor layer and encloses the source region. A channel region is formed between the source region and a drain region on the semiconductor layer. When a bias voltage is applied between the gate region and the source region, carriers move to the drain region from the source region via the channel region. A source electrode is provided on the semiconductor layer with a source contact region provided between the source electrode and the source region to permit electrical connection therebetween. The source contact region is divided into a plurality of regions whose total area is smaller than the area of the corresponding portion of the source region.

BRIEF DESCRIPTION OF THE DRAWINGS

The invention, together with the objects and advantages thereof, may be better understood by reference to the following description of the presently preferred embodiments, together with the accompanying drawings, in which.

DETAILED DESCRIPTION OF THE PREFERRED EMBODIMENTS

Embodiment 1

The preferred embodiment of an n-channel surface gate type SIT embodying the present invention will now be described in connection with FIGS. 1 through 3.

Figure 1:
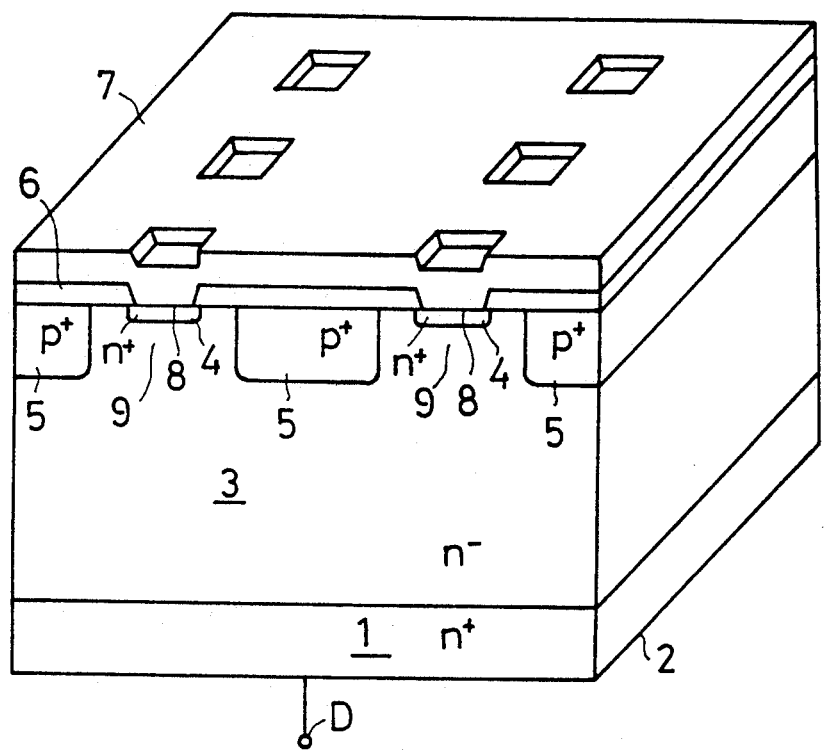
FIG. 1 is a perspective view of a first and preferred embodiment of a surface gate type transistor (SIT) according to the present invention.
Figure 2:
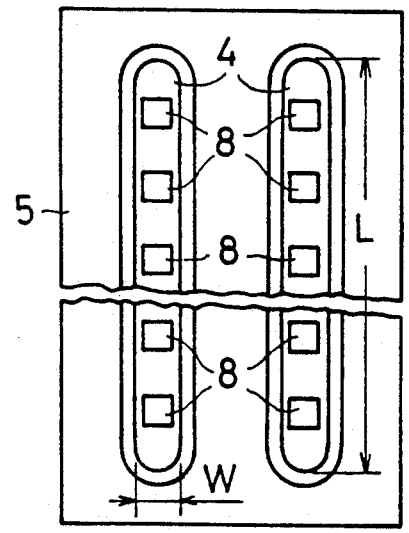
FIG. 2 is a top plan view of the SIT of FIG. 1, illustrating the relationship between the source region and source contact region which form a part of the SIT.

As shown in FIG. 1, an n+ type silicon substrate 2 acts as a drain region 1. An n− type epitaxial layer 3 is formed on the substrate 2. An n+ type source region 4 is formed on the surface of the epitaxial layer 3. As shown in FIG. 2, the source region 4 has a generally elliptical shape, with a width W and a length L. While in the preferred embodiment, the width W and the length L are about 3 μm and 100 μm, respectively, it should be understood to those skilled in the art that are values could alternatively be selected.

A p+ type gate region 5 is formed in a ring shape on the surface of the epitaxial layer 3 so as to surround the source region 4. An $SiO_2$ insulation layer 6 is formed on the surface of the epitaxial layer 3, but not on the source region 4. A source electrode 7 is formed on the insulation layer 6, with a plurality of source contact regions 8 formed on the inner side of the source electrode 7. The source contact regions 8 penetrate (extend through) the insulation layer 6 and are connected to the source region 4. Each source contact region 8 has a size of about 2 $\mu m \times 2$ $\mu m$.

A drain terminal D is connected to the silicon substrate 2. A p type impurity is implanted or diffused in the epitaxial layer 3 to form a channel region 9 underneath the source region 4. The channel region 9 serves as a potential barrier to inhibit movement of the carriers, thus switching off the SIT.

The insulation layer 6 is patterned to accommodate the source contact regions 8. The source contact regions 8 and the source electrode 7 are then formed in coordination with the pattern on the insulation layer 6. The other portions of the SIT can be formed according to known conventional techniques.

The operation of the above-described SIT will now be described in greater detail. This SIT is used with a forward bias voltage applied between the source and the drain by grounding the source electrode and by applying a positive potential to the drain terminal D. When the gate region is at the same potential as the source, the SIT is deactivated or switched OFF. When a forward bias is applied between the gate and source, holes are injected to the channel region 9 from the gate region 5, for causing the potential across the channel region 9 to drop. This induces electron injection to the channel region 9 from the source region 4, and causes electrons to flow between the drain and the source. As a result, the SIT is activated, and a drain current $I_D$ corresponding to a gate current $I_G$ flows through the SIT.

When the gate and source potentials are equal, or when a reverse bias is applied between the gate and the source, the holes are removed from the channel region 9, and the SIT is switched OFF.

As previously presented, conventional SIT's have a relatively low current gain. The present SIT however, has a higher current gain than the conventional SIT's. The contact region 8 of the present SIT is divided into a plurality of regions, thus making the area of each source contact region 8 smaller than the corresponding area in conventional device. This results in the flow of fewer holes into the source electrode 7, such that the hole density of the channel region 9 can be increased with the injection of fewer holes. A decrease in the potential of the channel region therefore causes the amount of electrons injected from the source to increase, thus increasing the current gain $h_{FS}$.

As the contact region 8 is divided into a plurality of regions, its total area is smaller than that of the source region. The source region is large since it is not divided. The electrons flowing from the source electrode 7 pass through the source region 4 and scatter around it, thus preventing local current concentration in the SIT. The current capacity is therefore increased, and the SIT can be used more effectively than conventional SIT devices. Furthermore, the segmentation of the source contact region 8 ensures a substantially even flow of the current, and a substantially uniform heat generation of the device. As the area of the source region 4 is kept large, the gate-source voltage $V_{GS}$ is smaller when the SIT is activated, thus reducing the power loss.

Figure 3:
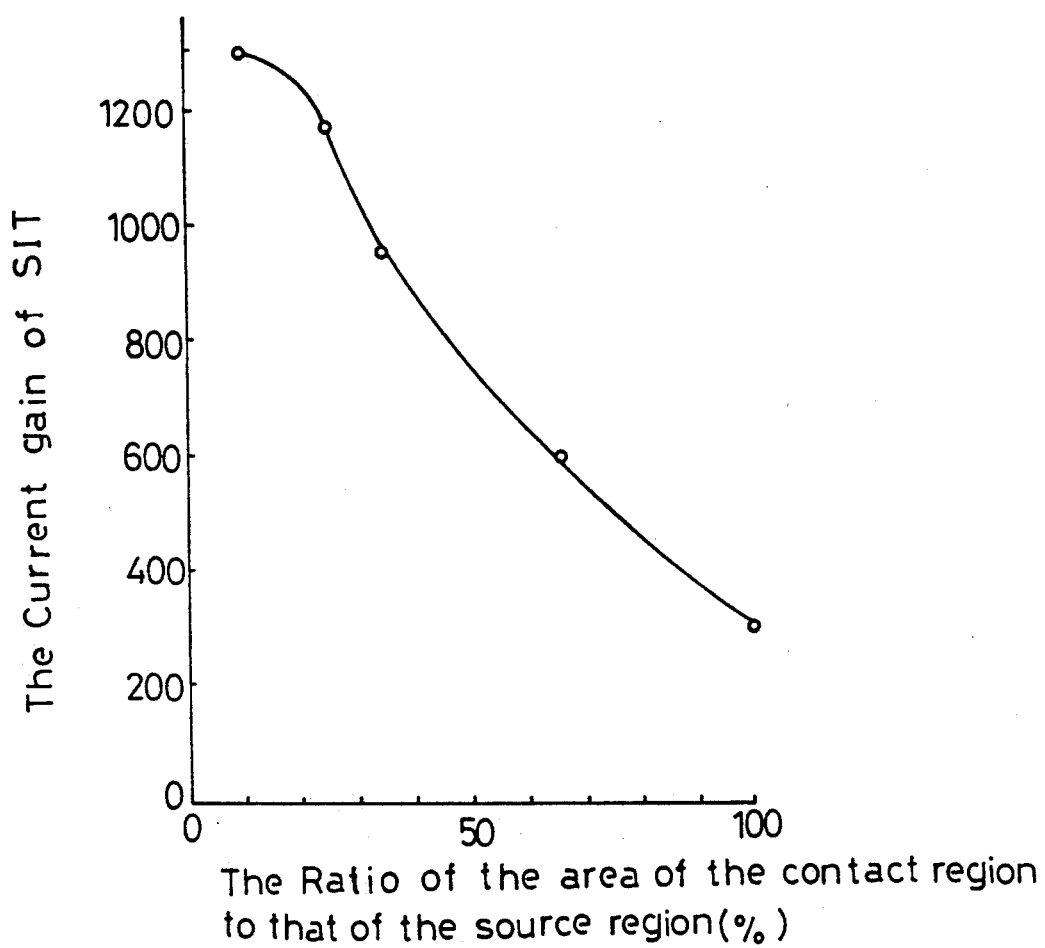
FIG. 3 is a graph illustrating the relationship between the current gain of the SIT of FIGS. 1 and 2, and the ratio of the area of the source contact region to the area of the source region.

FIG. 3 illustrates changes in the maximum current gain of the SIT as a function of the ratio of the area of the source contact region to that of the source region. The source region 4 has a size of about 3 $\mu m \times 100$ $\mu m$, and a single source contact region has a contact area of about 2 $\mu m \times 2$ $\mu m$. The graph in FIG. 3 was obtained by measuring the maximum current gains of multiple samples with different numbers of source contact regions. It is apparent from FIG. 3 that the current gain increases with a decrease in the contact area.

If the total area of the source contact regions 8 is made too small, the contact resistance increases. In this respect, it is practically preferable to set the total area of the source contact regions to 50% to 10% of the area of the source region.

Embodiment 2

Figure 4:
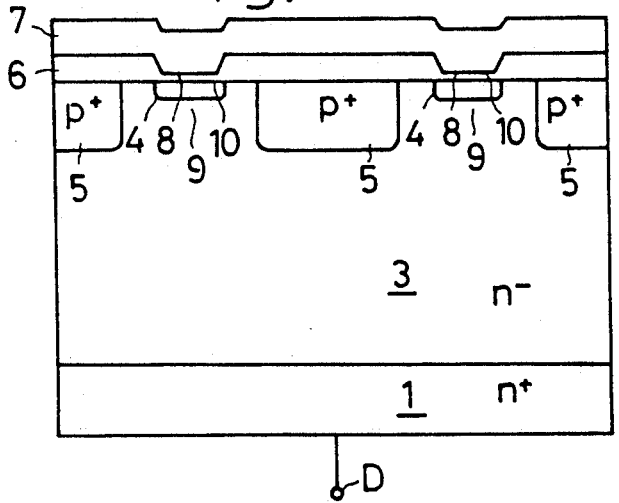
FIG. 4 is a partial cross-sectional view of a second embodiment of a SIT according to the present invention.
Figure 5:
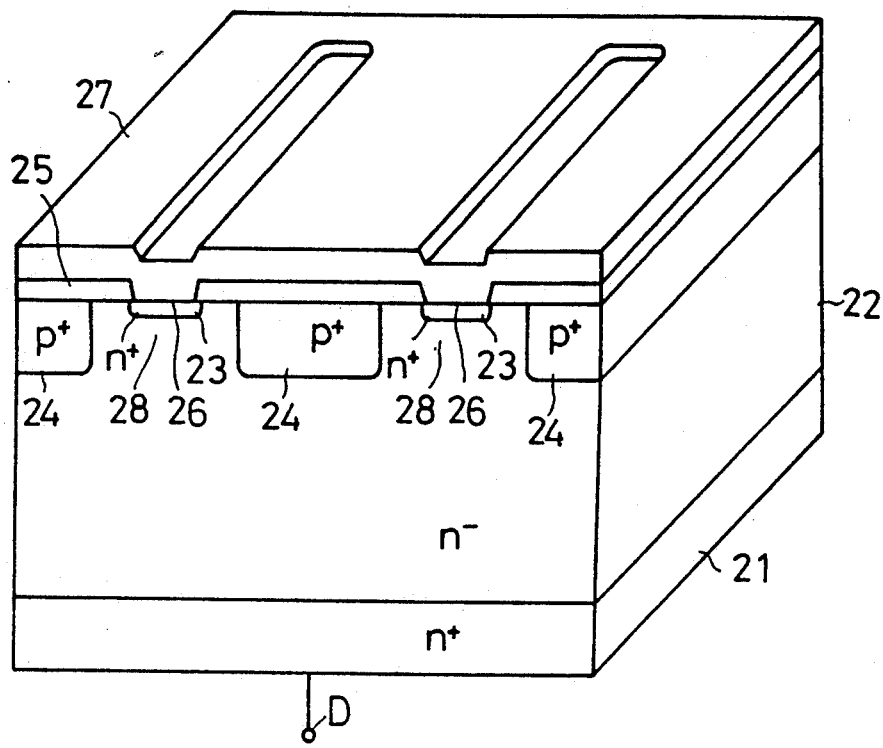
FIG. 5 is a perspective view of a conventional SIT.
Figure 6:
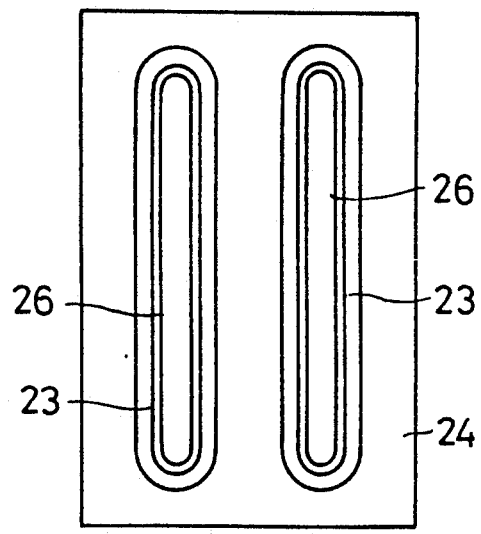
FIG. 6 is a top plan view of the conventional SIT according to FIG. 5.

A second embodiment will now be described with reference to FIG. 4. In this embodiment, a thin insulation layer 10 (e.g., $SiO_2$) of about 30 Å (Angstroms) is formed on that surface of the source region 4 which corresponds to the contact regions 8, instead of connecting the source region 4 directly to the source electrode 7. The source region 4 is connected via the insulation layer 10 to the source electrode 7. The insulation layer 10 serves as a tunnel for the injection of charge carriers. The remainder structure of the SIT is substantially similar to that of the preferred embodiment.

When the thin insulation layer 10 is provided between the source region 4 and the source electrode 7, electrons will enter the source region 4, but the current of the holes to the source electrode 7 is limited by the insulation layer, thus increasing the hole density in the channel region 9. The drain current $I_D$ therefore increases to further improve the current gain $h_{FS}$.

The present invention is not limited to the above-described embodiments. For instance, the source contact region 8 may be segmented differently than is disclosed in the foregoing embodiments, without departing from the gist of the invention. In addition, a p type channel could be used instead of the n type channel, such that the source and the drain are of a p type while the gate is of an n type, and holes become carriers. Furthermore, a channel region may be of the same type as the gate region.

What is claimed is:

1. A static induction type semiconductor device comprising:
   a semiconductor layer having an upper surface;
   a source region provided on said upper surface of said semiconductor layer;
   a gate region provided on said upper surface of said semiconductor layer surrounding said source region;
   a drain region provided in said semiconductor layer;
   a channel region provided between said drain region and said source region, whereby carrier movement occurs via said channel region between said source region and said drain region when a bias voltage is applied between said gate region and said source region;
   a source electrode provided on said semiconductor layer; and
   a plurality of separate source contact regions extending from said source electrode toward said source region for establishing separate spaced apart regions of electrical coupling to said source region with said regions of electrical coupling encompassing a total area that is less than the area of said source region.

2. A semiconductor device according to claim 1, wherein an insulation layer is interposed between said source electrode and said semiconductor layer, and said contact regions penetrate the insulation layer for coupling to said source region.

3. A semiconductor device according to claim 1, wherein said semiconductor layer is of an $n^-$ type, and wherein said source region, gate region and drain region are of an $n^+$ type, $p^+$ type and an $n^+$ type, respectively.

4. A semiconductor device according to claim 3, wherein said channel region is formed by implanting or diffusing a p type impurity in said $n^-$ semiconductor layer.

5. A semiconductor device according to claim 1, wherein a single source region is substantially 3 μm wide and 100 μm long, and each source contact region has a size of about 2 μm×2 μm.

6. A semiconductor device according to claim 1, wherein the ratio of said total area of said plurality of source contact regions corresponding to a single source region to the area of that source region ranges between 10% and 50%.

7. A semiconductor device according to claim 1, wherein an insulation layer is provided between said source region and source contact regions to permit tunnel injection of charge carriers into said source region.

8. A semiconductor device according to claim 1, wherein said source region, gate region and drain region are of a $P^+$ type, $n^+$ type and $P^+$ type, respectively.

* * * * *